(12) United States Patent
Hierholzer

(10) Patent No.: US 7,579,682 B2
(45) Date of Patent: Aug. 25, 2009

(54) POWER SEMICONDUCTOR MODULE

(75) Inventor: Martin Hierholzer, Moehnesee (DE)

(73) Assignee: Infineon Technologies AG, Munich (DE)

( * ) Notice: Subject to any disclaimer, the term of this patent is extended or adjusted under 35 U.S.C. 154(b) by 482 days.

(21) Appl. No.: 11/460,867

(22) Filed: Jul. 28, 2006

(65) Prior Publication Data

US 2007/0158859 A1 Jul. 12, 2007

(30) Foreign Application Priority Data

Aug. 1, 2005 (DE) .................. 10 2005 036 116

(51) Int. Cl.
*H01L 23/02* (2006.01)
(52) U.S. Cl. .............. 257/685; 257/678; 257/713; 257/690; 257/692; 257/666
(58) Field of Classification Search .......... 257/666, 257/678, 685, 690, 692, 713
See application file for complete search history.

(56) References Cited

U.S. PATENT DOCUMENTS

| | | | | |
|---|---|---|---|---|
| 5,539,254 | A * | 7/1996 | Eytcheson et al. | 257/691 |
| 5,870,289 | A * | 2/1999 | Tokuda et al. | 361/779 |
| 6,255,672 | B1 * | 7/2001 | Yoshioka et al. | 257/107 |
| 6,610,417 | B2 * | 8/2003 | Andresakis et al. | 428/607 |
| 6,985,347 | B2 * | 1/2006 | Stevenson et al. | 361/302 |
| 2002/0089046 | A1 * | 7/2002 | Hierholzer | 257/678 |
| 2002/0113286 | A1 * | 8/2002 | Shimizu | 257/502 |
| 2005/0230837 | A1 * | 10/2005 | Taghizadeh-Kaschani | 257/760 |
| 2007/0120639 | A1 * | 5/2007 | Strzalkowski et al. | 336/232 |

FOREIGN PATENT DOCUMENTS

| | | |
|---|---|---|
| DE | 10227106 A1 | 1/2004 |
| JP | 07263621 A | 10/1995 |
| JP | 2001352034 A | 12/2001 |

OTHER PUBLICATIONS

German Office Action for German Patent Application No. 102005036116.1 (4 pages).

* cited by examiner

*Primary Examiner*—M. Wilczewski
*Assistant Examiner*—Telly D Green
(74) *Attorney, Agent, or Firm*—Coats & Bennett, P.L.L.C.

(57) ABSTRACT

A power semiconductor module has a ceramic substrate (9) which has on at least one side a patterned metallization (50) with a fineness of pattern of smaller than or equal to 800 μm, a first semiconductor chip (10) which has a power semiconductor component and which is arranged on the patterned metallization (50), and a second semiconductor chip (30) which has drive electronics for driving the first semiconductor chip (10) and which is arranged on the patterned metallization (50). Furthermore, at least one thin-wire bond (2, 3) with a bonding-wire diameter (d2, d3) of smaller than or equal to 75 μm is provided which is formed between the patterned metallization (50) and the second semiconductor chip (30).

25 Claims, 11 Drawing Sheets

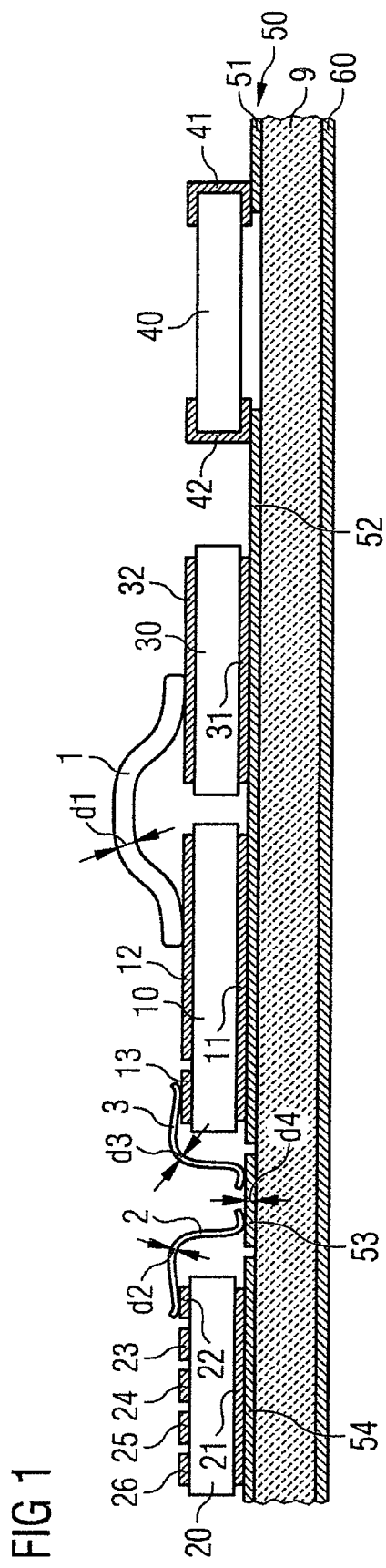

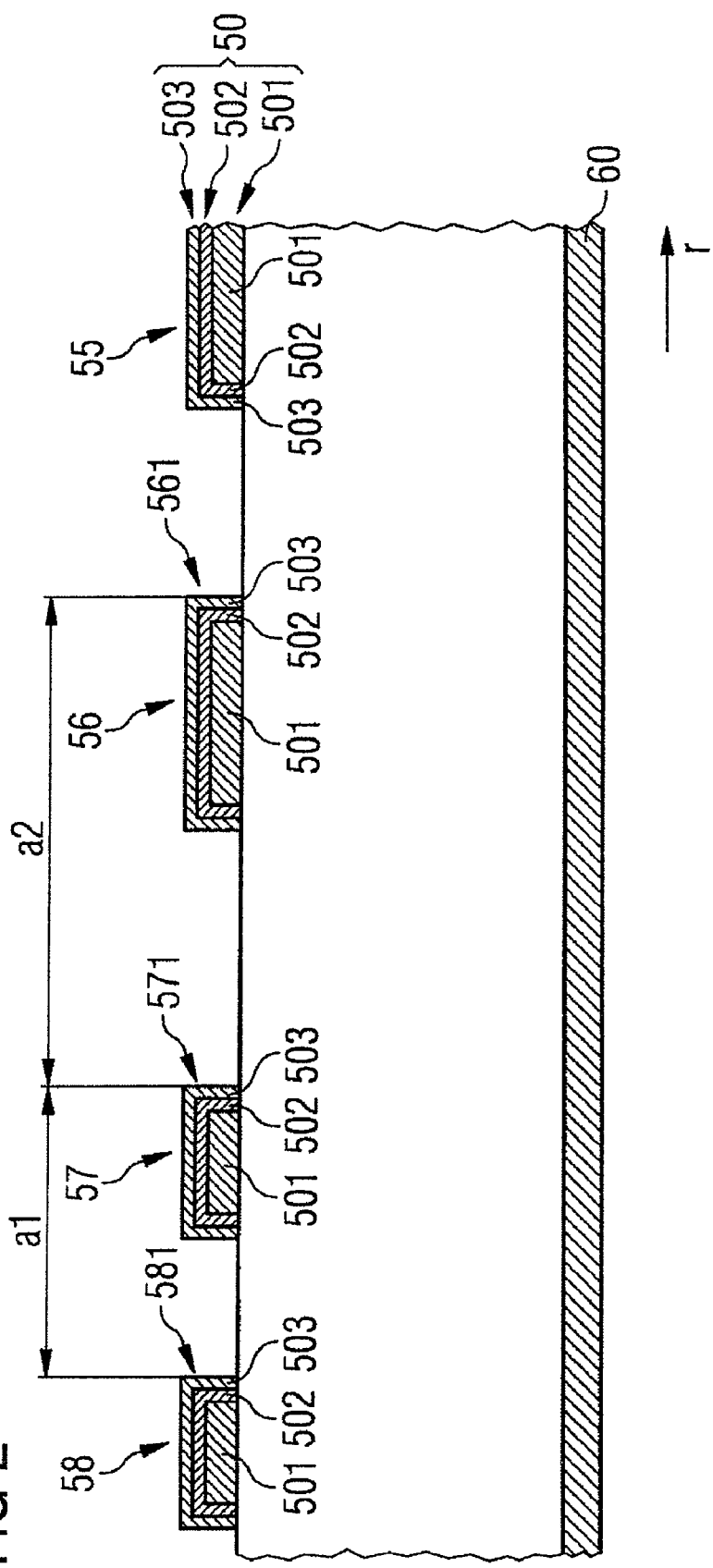

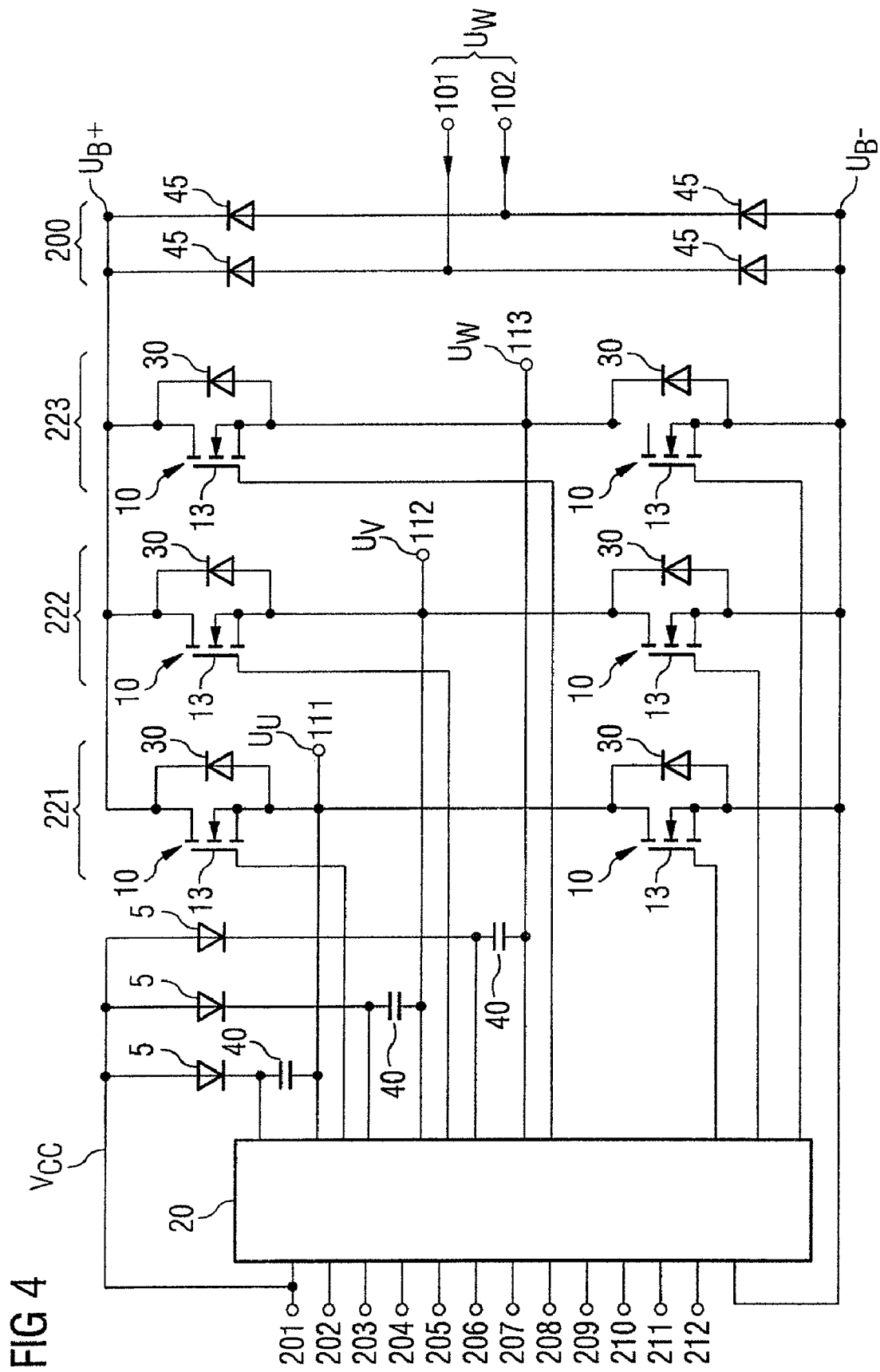

FIG 6A
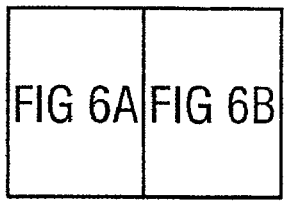
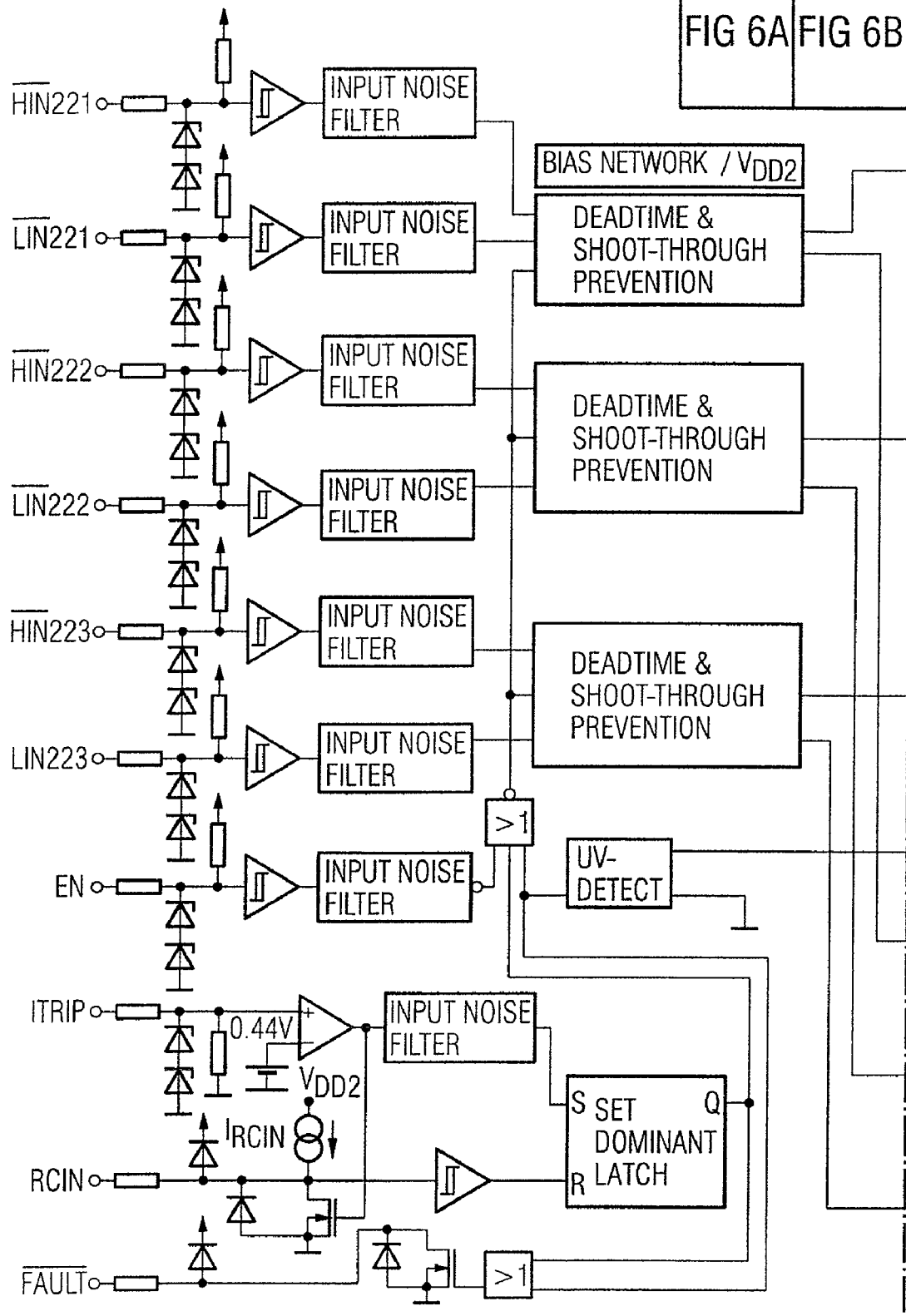

POWER SEMICONDUCTOR MODULE

PRIORITY

This application claims priority from German Patent Application No. DE 10 2005 036 116.1, which was filed on Aug. 1, 2005, and is incorporated herein by reference in its entirety.

TECHNICAL FIELD

The invention relates to a power semiconductor module.

BACKGROUND

Current power semiconductor modules usually comprise only a power section which essentially consists of a mostly ceramic substrate on which one or more controllable power semiconductor components are arranged. The drive circuit for driving these controllable power semiconductor components is implemented on a circuit board independent of the power semiconductor module.

In addition, a power semiconductor module is known, for example, from DE 102 27 106 A1, in which a drive and evaluating circuit arranged on a separate circuit board is provided inside the module. The electrical connection between the circuit section and the drive electronics is produced by means of a plug-in system.

The disadvantage of such an arrangement consists in the elaborate construction requiring many individual components and method steps.

SUMMARY

The power semiconductor module according to the invention comprises a ceramic substrate which has on at least one side a patterned metallization with a fineness of pattern of smaller than or equal to 800 μm. On the patterned metallization, a first and a second semiconductor chip and a ceramic capacitor are arranged. The first semiconductor chip comprises a power semiconductor component, the second semiconductor chip comprises drive electronics for driving the first semiconductor chip.

Between the patterned metallization and the second semiconductor chip, at least one thin-wire bond with a bonding-wire diameter of smaller than or equal to 75 μm is produced.

BRIEF DESCRIPTION OF THE DRAWINGS

In the text which follows, preferred exemplary embodiments of the invention are explained in greater detail, referring to the figures of the drawing. In the figures, identical reference symbols designate identical elements. In the figures:

FIG. 1 shows the assembled substrate of a power semiconductor module according to the invention in cross section, FIG. 2 shows a substrate with a patterned metallization in cross section, FIG. 4 shows a circuit diagram of the assembled substrate according to FIG. 3a, FIG. 5 shows a circuit diagram with a three-phase full bridge driven by a drive circuit, FIG. 6 shows a block diagram showing the logic units, explained in FIG. 5, for driving the half bridges, FIG. 6A shows a first portion of the drive circuit of FIG. 6.

DETAILED DESCRIPTION

Figure 3A:
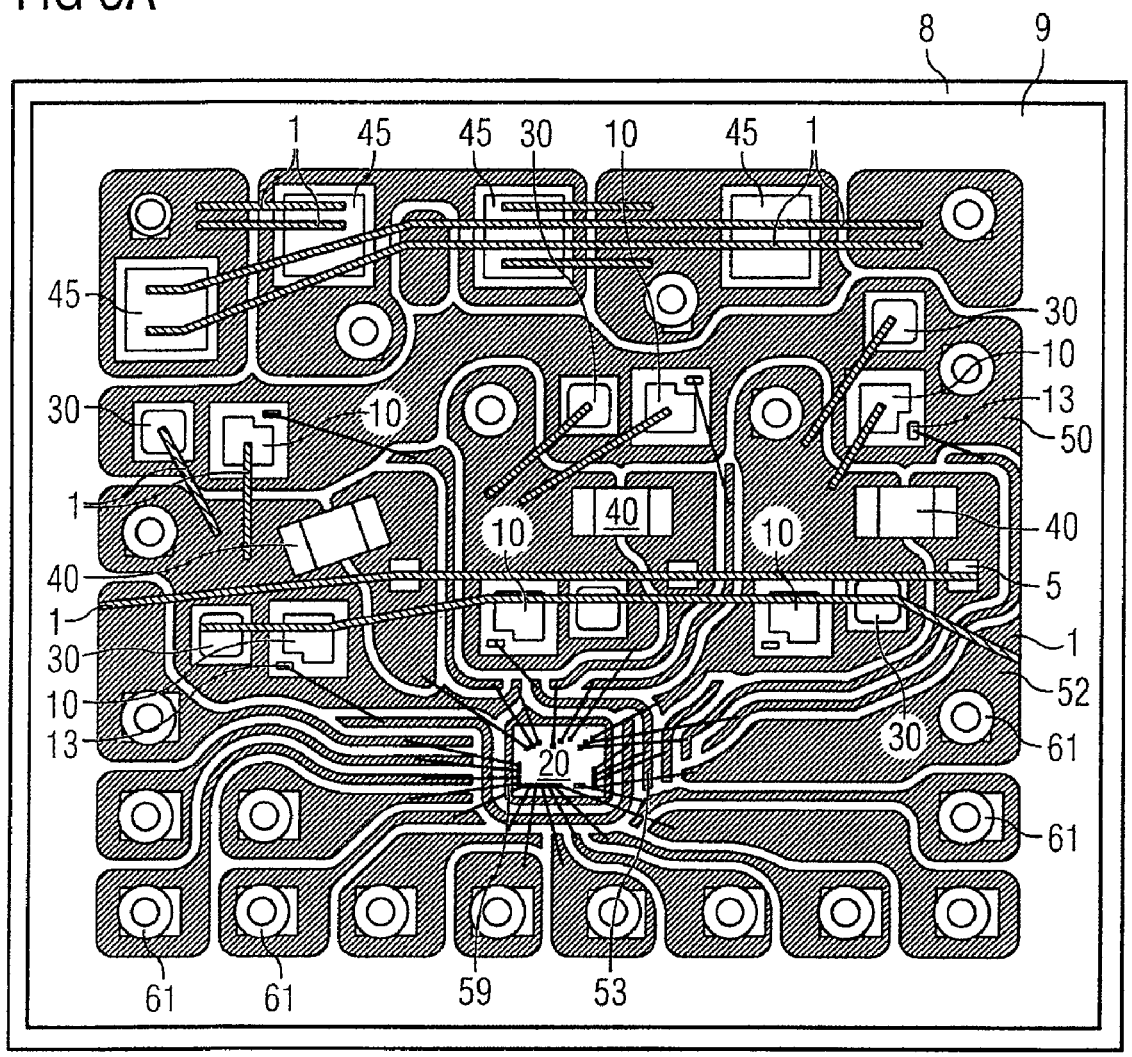
FIG. 3a shows an assembled substrate of a power semiconductor module according to the invention in top view.

FIG. 1 shows a ceramic substrate 9 which is provided with a patterned metallization 50 on its upper side and with a metallization 60 on its lower side. Together, the substrate 9 and the metallizations 50, 60 form a DCB (Direct Copper Bonding) substrate.

On the DCB substrate, a first semiconductor chip 10, a second semiconductor chip 20, a third semiconductor chip 30 and a ceramic capacitor 40 are arranged. Due to the patterning of the metallization layer 50, sections 51, 52, 53, 54 selected to meet circuit requirements are produced by means of which the relevant semiconductor chips 10, 20, 30 and other components such as, e.g., the ceramic capacitor 40 can be connected electronically and/or mechanically. The connections can be established, for example, by means of solder, not shown.

The first semiconductor chip 10 is constructed as controllable power semiconductor component, for example as IGBT or as MOSFET, and has a first load terminal 11, a second load terminal 12 and a gate terminal 13.

The third semiconductor chip 30 is constructed as freewheeling diode with a first load terminal 31 and a second load terminal 32 and connected in parallel with the load current path of the first semiconductor chip 10. For this purpose, the first load terminals 11, 31 of the first and third semiconductor chip 10, 30, respectively, are connected via a section 52 of the patterned metallization 50. The second load terminals 12, 32 of the first and third semiconductor chip 10, 30, respectively, are electrically connected by thick-wire bonding by means of a bonding wire 1. The bonding wire 1 has a diameter d1 of, for example, 300 μm, 400 μm or 500 μm.

The second semiconductor chip 20 comprises drive electronics for driving the controllable power semiconductor component implemented in the first semiconductor chip 10. The second semiconductor chip 20 has a first terminal 21 which is electrically and mechanically connected to a section 54 of the patterned metallization 50. On its side facing away from the substrate 9, the second semiconductor chip 20 has other, very finely patterned terminals 22 to 26. These terminals are used for driving the controllable power semiconductor component 10 and possibly other power semiconductor components, not shown.

For the purpose of driving, the terminals 22 to 26 of the drive electronics 20 on the upper side must be connected to the gate terminals of the relevant controllable power semiconductor components. In FIG. 1, only the connection between terminal 22 of the drive electronics 20 and the gate terminal 13 of the controllable power semiconductor component 10 is shown by way of example.

Because of the fine patterning of the terminals 22 to 26 of the drive electronics 20 on the upper side, the bonding wires 2, 3 used for this purpose must only have very small diameters d2 and d3, respectively. The diameters d2, d3 of the bonding wires 2, 3 are preferably smaller than or equal to 75 μm, smaller than or equal to 50 μm or particularly preferably smaller than or equal to 25 μm.

Power semiconductor modules usually have not only one but preferably a number of, for example 2, 4 or 6 power semiconductor components which are constructed as power semiconductor chips and which are driven by common drive electronics 20. This results in the necessity that certain ones of the controllable power semiconductor components 10 are spaced apart from the drive electronics 20 by such a distance that a direct bond between the gate terminal 13 of the controllable power semiconductor component 10 and the relevant terminal 22 of the drive electronics 20 can no longer be achieved by means of thin-wire bonding, i.e. the connection must be made indirectly, for example by interposing a conductor track 53 of the patterned metallization 50. This thus requires a thin-wire bond by means of a bonding wire 2 between the terminal 22 and the conductor track 53.

Since metallizations 50, 60, formed, for example, of copper or copper alloys, due to an internal grain structure and due to the surface roughness of the substrate 9 on which the metallizations 50, 60 are deposited, have a surface roughness which is also very high, it is not possible to establish a permanent thin-wire bond on these. It is thus provided, according to the invention, to select at least the mean peak-valley depth Rz of the metallization layer 50 to be less than or equal to 7 μm and its maximum peak-valley depth Rmax to be less than or equal to 10 μm. The mean peak-valley depth Rz and the maximum peak-valley depth Rmax are determined in accordance with the German standards DIN 4768 and DIN 4287.

A reduction in the surface roughness of the metallizations 50, 60, and thus an improvement in the bondability, particularly in the case of thin-wire bonding, can be achieved, for example, in that the patterned metallization 50 has a nickel layer with a thickness of 2 μm to 12 μm and/or a gold layer with a thickness of 10 nm to 1 μm. In addition or as an alternative to the nickel or gold layer, the surface roughness of the patterned metallization 50 can be reduced, e.g. by grinding and polishing.

In addition to the controllable power semiconductor components 10, the freewheeling diodes 30 and the drive electronics 20, other components and/or assemblies such as, e.g. bootstrap circuits, microcontrollers, capacitors, coreless transformers for DC isolation between the drive electronics and certain ones of the controllable power semiconductor components 10, or other components can be arranged on the metallizations 50, 60 of the substrate 9. In FIG. 1, a ceramic capacitor 40 is shown by way of example, the terminals 41, 42 of which are soldered to sections 51 and 52, respectively, of the patterned metallization 50.

The arrangement shown in FIG. 1 shows how an assembled substrate of a power semiconductor module according to the invention can be constructed, in principle. However, the type of patterning of the patterned metallization 50 and type, number and positioning of the elements arranged on the ceramic substrate 9 with respect to one another can be selected freely, in principle.

The patterned metallization 50 has a fineness of pattern of smaller than or equal to 800 μm, preferably smaller than or equal to 600 μm. The term fineness of pattern will be explained in greater detail with reference to FIG. 2 in the text which follows.

FIG. 2 shows another cross section through a section of the ceramic substrate 9 according to FIG. 1, provided with the patterned metallization 50 and metallization 60. The patterned metallization 50 has spaced-apart sections 55, 56, 57, 58. Mutually corresponding edges 581, 571 of the sections 58 and 57 have a particular spacing a1 in a particular lateral direction r. Similarly, mutually corresponding edges 571, 561 of the sections 57 and 56 have a spacing a2 in the lateral direction r. Corresponding spacings can be determined for all adjacent sections of the patterned metallization. The spacings a1, a2 will also be called pattern spacing in the text which follows. If all possible pattern spacings a1, a2 are determined in all possible lateral directions r (see, for example, lateral directions r, r1, r2, r3 and r4 in FIG. 3a), i.e. in all directions extending in parallel with the surface of the substrate 9, the smallest pattern spacing occurring is called fineness of pattern in the sense of the present invention.

According to the invention, it is provided to provide a fineness of pattern of smaller than or equal to 800 μm, preferably smaller than or equal to 600 μm, for the patterned metallization 50.

The patterned metallization 50 has progressively a layer 501 of copper or of a copper alloy followed by an optional nickel layer 502 and an optional gold layer 503. The optional nickel layer 502 and the optional gold layer 503 preferably cover the layers of the metallization 50 located underneath them in each case in this arrangement, particularly also at their side faces formed by the patterning. In particular, electrode deposition is suitable for producing the optional nickel layer 502 and the optional gold layer 503.

FIG. 3a shows a top view of the upper side of the ceramic substrate 9 according to FIGS. 1 and 2 and its patterned metallization 50. In FIG. 3a, however, the patterning of the metallization 50 is different and the elements located thereon are arranged differently in space.

The arrangement comprises three half bridges with in each case two series-connected IGBTs 10 and in each case two freewheeling diodes 30. For each of the branches, a bootstrap diode 5 and a ceramic capacitor 4 are provided. The half bridge circuit is supplied with voltage via a bridge rectifier by means of four rectifier diodes 45. The six IGBTs 10 are driven by a common drive electronics 20. For this purpose, the gate terminals 13 of the IGBTs 10 are connected to corresponding terminals of the drive electronics 20, using conductor tracks 53 which are formed from sections of the patterned metallization 50, and by using thin bonding wires 2 having diameters of smaller than or equal to 75 μm, smaller than or equal to 38 μm, smaller than or equal to 33 μm or smaller than or equal to 25 μm.

To connect the load terminals 12 of the controllable power semiconductor components 10, located on the upper side, and the load terminals 32 of the freewheeling diodes 30 on the upper side, and also the load terminals of the rectifier diodes 45 on the upper side, bonding wires 1 having large diameters, for example 300 μm, 400 μm or 500 μm, are used.

The advantage of such an arrangement consists in that all components to be soldered onto the patterned metallization 50 of the substrate 9 can be soldered jointly in one step, for example by means of a vacuum soldering process in a through-type vacuum furnace. Suitable solders are preferably lead-free solders having a melting point of less than 230° C.

The bonds between the components and the sections of the patterned metallization are established preferably after the soldering.

The assembled module substrate 9 is preferably electrically connected by means of ferrules 61, which are soldered onto corresponding sections of the patterned metallization 50, for the drive and the load terminals of the half bridges. To establish the electrical connection, pins are inserted into the ferrules 61 and pressed together with these. The pins have an outside diameter which is larger than the inside diameter of the ferrules 61. The pins and/or the ferrules 61 are preferably tin-coated.

Due to the integrated construction, no terminals carrying high voltage need to be brought out of the module with the exception of the load terminals.

The substrate 9 can be used at the same time as baseplate of a module housing. As a result, the module can be advantageously brought into contact with a heat sink 8 with the metallization 60. The heat sink is mounted on the substrate 9 preferably by means of a clamping spring.

Figure 3B:
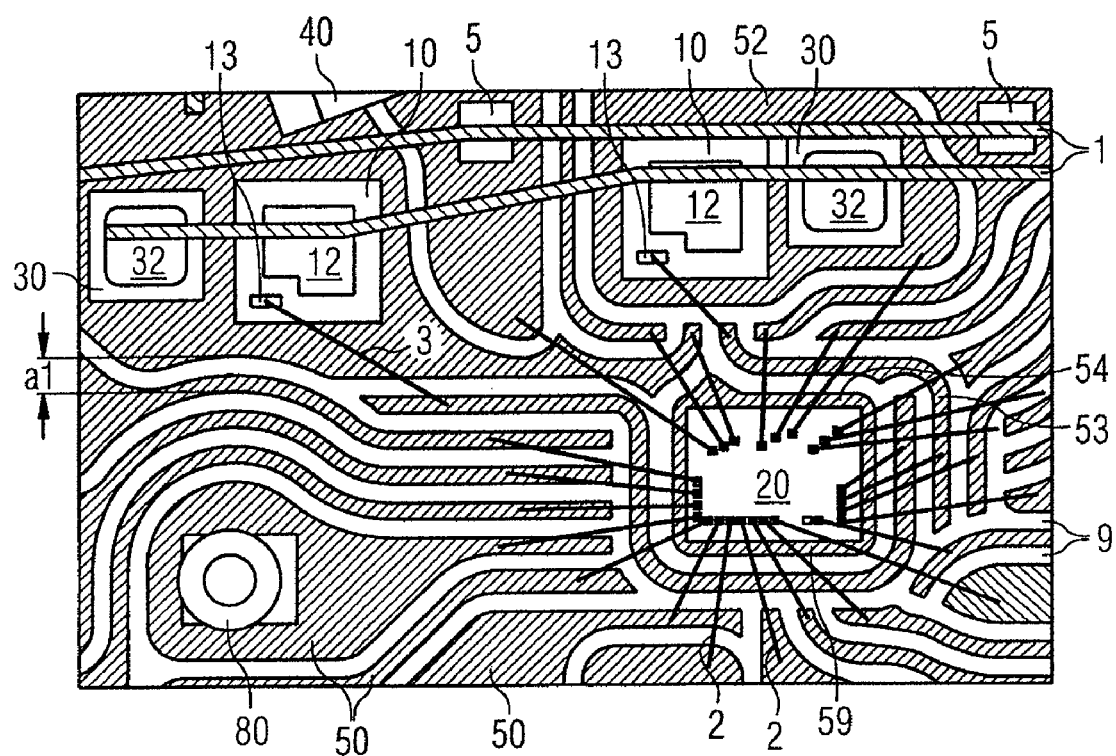
FIG. 3b shows an enlarged section of the assembled substrate according to FIG. 3a in the area of the drive electronics.

FIG. 3b shows an enlarged section of the assembled substrate 9 according to FIG. 3a in the area of the drive electronics 20.

In particular, the thin bonding wires 2 can be seen which, for example, connect the terminals (bond pads), not designated in greater detail, of the drive electronics 20, which correspond to the terminals 22 to 26 in FIG. 1, to conductor tracks of the patterned metallization 50. The drive electronics 20 are arranged on a section 59 of the patterned metallization 50 which is preferably spaced apart from the other sections of the patterned metallization 50 and electrically insulated from these.

According to an alternative, not shown in FIGS. 3a and 3b, the section 59 can also be connected electrically conductively to a terminal of one of the power switches of the lower half bridge branches which is provided for connecting a supply voltage $UB_+$ to this half bridge. This is advantageous, in particular, if the drive circuit is constructed as SOI chip according to FIG. 7. According to FIG. 1, the thick bonding wires 1 used for transmitting power connect the second load terminals 12, 32 of selected IGBTs 10 or of selected freewheeling diodes 30, respectively, with one another and—see also FIG. 3a—to power-transmitting sections 52 of the patterned metallization 50.

FIG. 4 shows the circuit diagram for the arrangement according to FIG. 3a. Six IGBTs 10 are series-connected with their load current paths in pairs to form half bridges 221, 222, 223 so that a total of three half bridges 221, 222, 223 are formed. In each case, a freewheeling diode 30 is connected in antiparallel with the load current path of each IGBT 10.

The three half bridges 221, 222, 223, in turn, are connected in parallel and are supplied via a direct voltage $UB_+$-$UB_-$ which is generated by a bridge rectifier 200, formed from four diodes 45, from an alternating voltage UW supplied by inputs 101, 102. $UB_+$ represents the positive supply potential and $UB_-$ represents the negative supply potential of the half bridges.

The half bridges 221, 222, 223 are driven by means of the control electronics 20 via the gate terminals of the IGBTs 10. A bootstrap circuit of a bootstrap diode 5 and a capacitor 4 is in each case connected to the IGBTs 10 of the upper half bridge branch of the half bridges 221, 222, 223 in each case.

By suitably driving the half bridges 221, 222, 223, a three-phase voltage can be provided at outputs 111, 112, 113 of the half bridges, for example for supplying a motor with voltage.

The drive electronics 20 have external terminals 201 to 212 which are DC-decoupled with respect to the supply potentials $UB_+$ and $UB_-$ and with respect to the potentials $U_U$, $U_V$ and $U_W$, present at the outputs 111, 112, 113, or can be DC-coupled to these. In the case of decoupling, this is preferably done by means of coreless transformers (CLTS) which can be integrated in the drive electronics. Due to the DC decoupling, the external terminals can be brought out of a housing of the power semiconductor module without problems.

Figure 5:
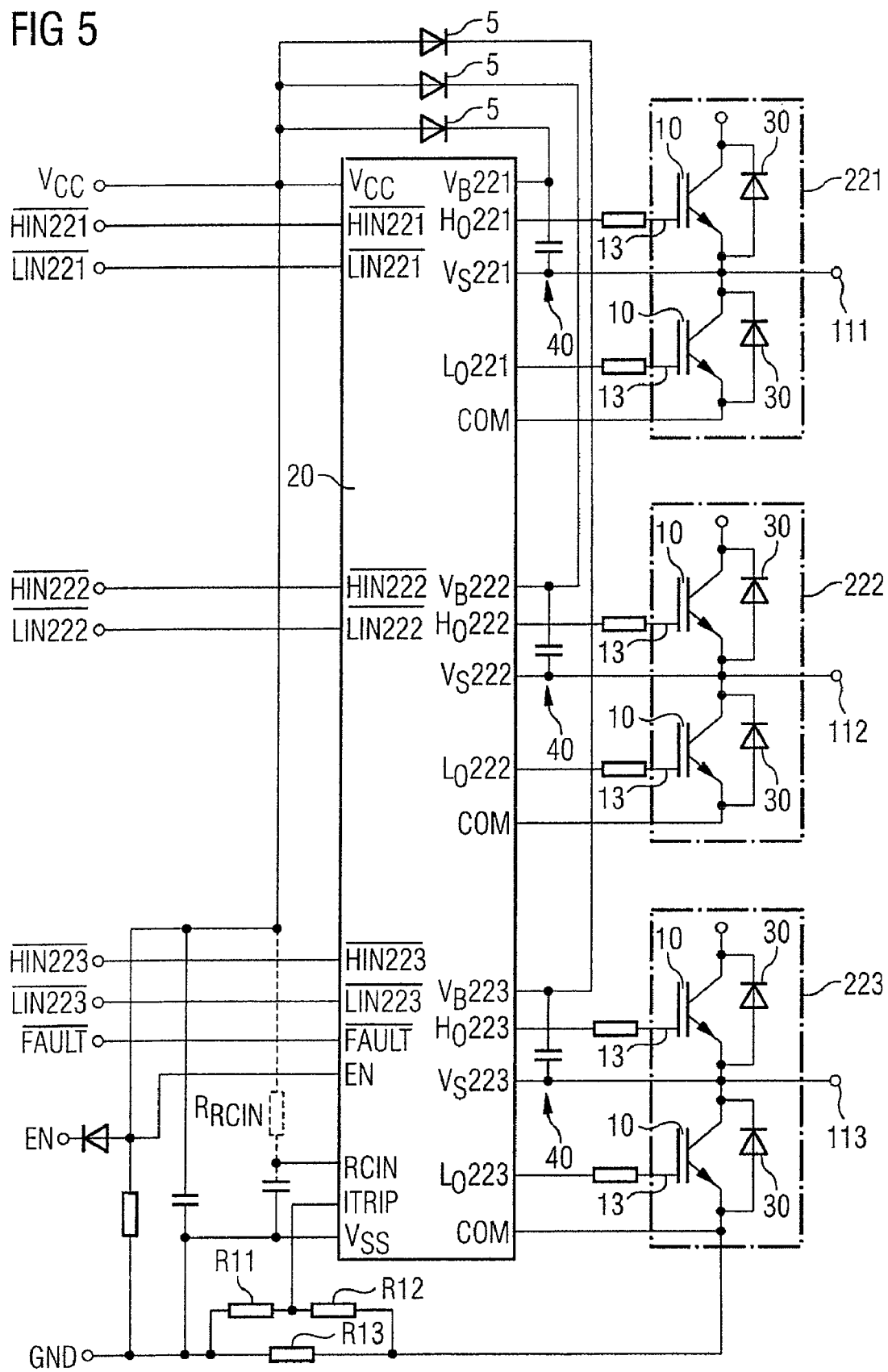

FIG. 5 shows a basic circuit diagram with a drive circuit 20 for a three-phase full bridge.

The three-phase full bridge comprises three half bridges 221, 222, 223 having in each case two power switches 10, constructed as IGBTs, for example, the load current paths of which are in each case connected in series, and freewheeling diodes 30, one of which in each case is connected in antiparallel with each of the load current paths. Apart from the fact that IGBTs are provided instead of MOSFETs as power switches and that the gate terminals of the power switches 10 are in each case preceded by a resistor, this part of the circuit diagram corresponds to the correspondingly designated half bridges 221, 222, 223 according to FIG. 4.

In principle, however, any controllable power switches, in particular MOSFETs and IGBTs, can be used as controllable power switch 10.

The drive circuit 20 comprises an independent driver for each of the power switches 10. These drivers are driven by gate inputs $H_{IN}221$, $H_{IN}222$, $H_{IN}223$, $L_{IN}221$, $L_{IN}222$, $L_{IN}223$. The appended numbers 221, 222, 223 specify the half bridge 221, 222 and 223, respectively, which is driven by the signals supplied to the relevant gate input $H_{IN}221$, $H_{IN}222$, $H_{IN}223$, $L_{IN}221$, $L_{IN}222$, $L_{IN}223$.

"H" here means that the relevant signal drives the upper power switch 10 ("high side") of the relevant half bridge 221, 222, 223 which is connected to the higher supply potential of this half bridge.

"L" correspondingly means that the relevant signal drives the lower power switch 10 ("low side") of the relevant half bridge 221, 222, 223 which is connected to the lower supply potential of this half bridge 221, 222, 223.

At the output end, the units 231, 232, 233 in each case have outputs which are designated by $V_B$, $H_O$, $V_S$ and $L_O$ and which are followed by a number, the outputs designated by $H_O$ being provided for driving the upper power switch 10 and the outputs designated by $L_O$ being provided for driving the lower power switch 10 of the relevant half bridge 221, 222, 223.

At an input $I_{TRIP}$ of the drive circuit 20, a resistance network R11, R12, R13; R21, R22, R23 and R31, R32, R33, respectively, is connected, the dimensioning of which determines the load current from which the half bridge 221, 222 and 223, respectively, is switched off by the relevant half bridge 221, 222 and 223, respectively.

In principle, the components connected externally to the drive circuit 20 in FIG. 5, particularly resistors and/or capacitors and/or diodes, can also be integrated in the drive circuit.

FIG. 6 shows a block diagram of the drive circuit 20, shown in FIG. 5, for a three-phase full bridge.

Figure 6B:
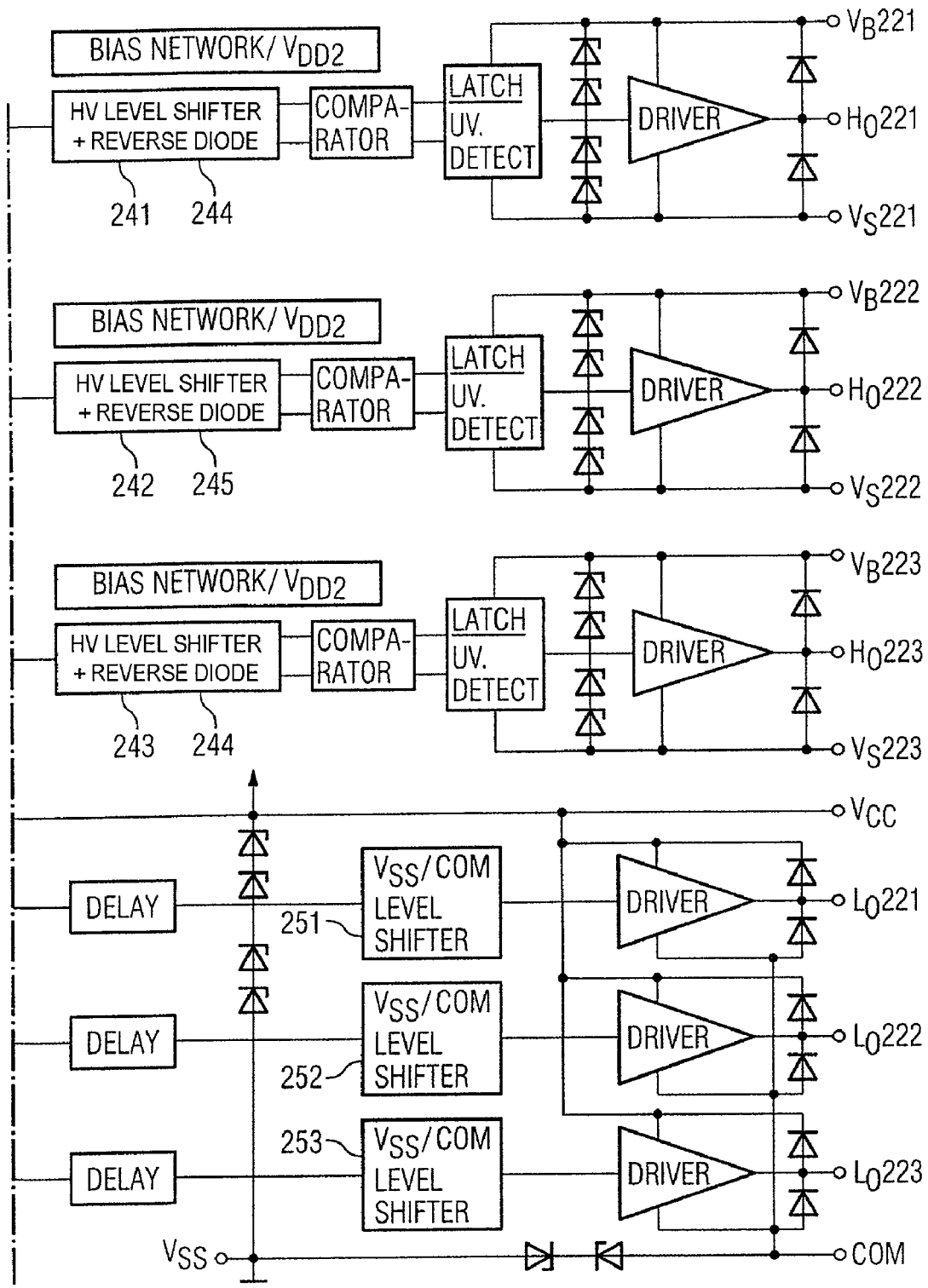
FIG. 6B shows a second portion of the drive circuit of FIG. 6.

FIGS. 6A and 6B show block diagrams of FIG. 6 in more detail.

It can be seen that a high voltage level shifter ("HV level shifter") 241, 242, 243 and a reverse diode 244, 245, 246 are in each case provided for the upper ones of the power switches 10 (high side).

Furthermore, a level shifter 251, 252, 253 is in each case provided for the lower ones of the power switches 10 (low side).

The high-voltage level shifters 241, 242, 243 and the level shifters 251, 252, 253 are used for adapting the signal levels of the drive signals present at the inputs $H_{IN}221$, $H_{IN}222$, $H_{IN}223$, $L_{IN}221$, $L_{IN}222$, $L_{IN}223$ of the drive circuit 20, which are preferably present as digital low-voltage signals, e.g. as CMOS or LS-TTL signals, to the levels required for driving the gate terminals 13 of the power switches 10.

The drive circuit 20, shown in FIG. 6, is preferably completely constructed in an SOI (silicon on insulator) chip which, together with the power switches 10, the freewheeling diodes 30, the bootstrap diodes 5, the capacitors 40 according to FIGS. 3a and 3b, is arranged on one substrate 9.

Figure 7:
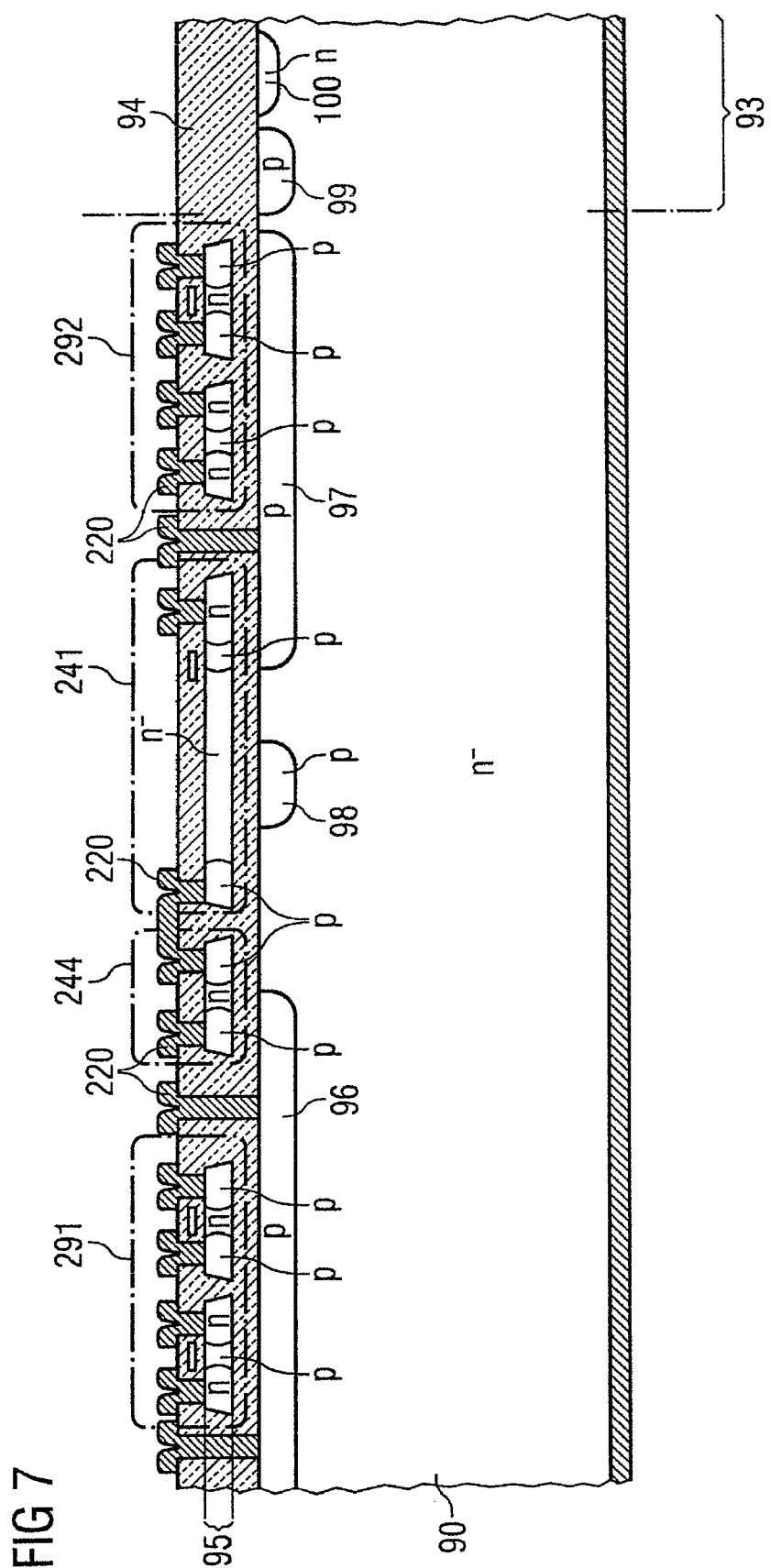
FIG. 7 shows a cross section through a section of an SOI chip which comprises a drive circuit for driving a three-phase full bridge and three high-voltage level shifters, in the area of one of the high-voltage level shifters.

FIG. 7 shows a cross section through a section of an SOI chip in the area of a high-voltage level shifter 241.

The SOI chip comprises a semiconductor body 90 and a semiconductor layer 95 which is electrically insulated from the semiconductor body 90 by means of an insulator layer 94.

In the semiconductor layer 95, a high-voltage level shifter 241, a reverse diode 244 and two transistor pairs 291, 292 are constructed for driving a half bridge.

The transistor pair 291 is provided for driving the power switch of the upper branch of the half bridge, the transistor pair 292 is provided for driving the power switch of the lower branch of the half bridge.

The high-voltage level shifter 241 is constructed in the form of a transistor and is used for compensating for the usually very high potential difference occurring in driving the half bridge between the gate terminal of the power switch of the upper branch of the half bridge and the gate terminal of the power switch of the lower branch of the half bridge.

An arrangement according to FIG. 7, particularly preferably on the same SOI chip, is preferably provided for each half bridge for driving a three-phase full bridge.

Adjoining the insulator layer 94, p-doped zones 96, 97 ("shield regions") are formed in the essentially weakly n-doped semiconductor body 90.

A p-doped channel stopper 98 is provided for preventing a transistor effect of a transistor which is formed from the p-doped zones 96 and 97 and the intermediate, weakly n-doped section of the semiconductor body 90.

Furthermore, an edge structure having a p-doped zone 99 and an n-doped zone 100 is provided in an edge area 93.

In addition, metallic terminal contacts 220 are provided for electrically contacting and/or electrically connecting the various semiconductor regions 96, 97 and particular zones of the semiconductor layer 95.

Figure 8:
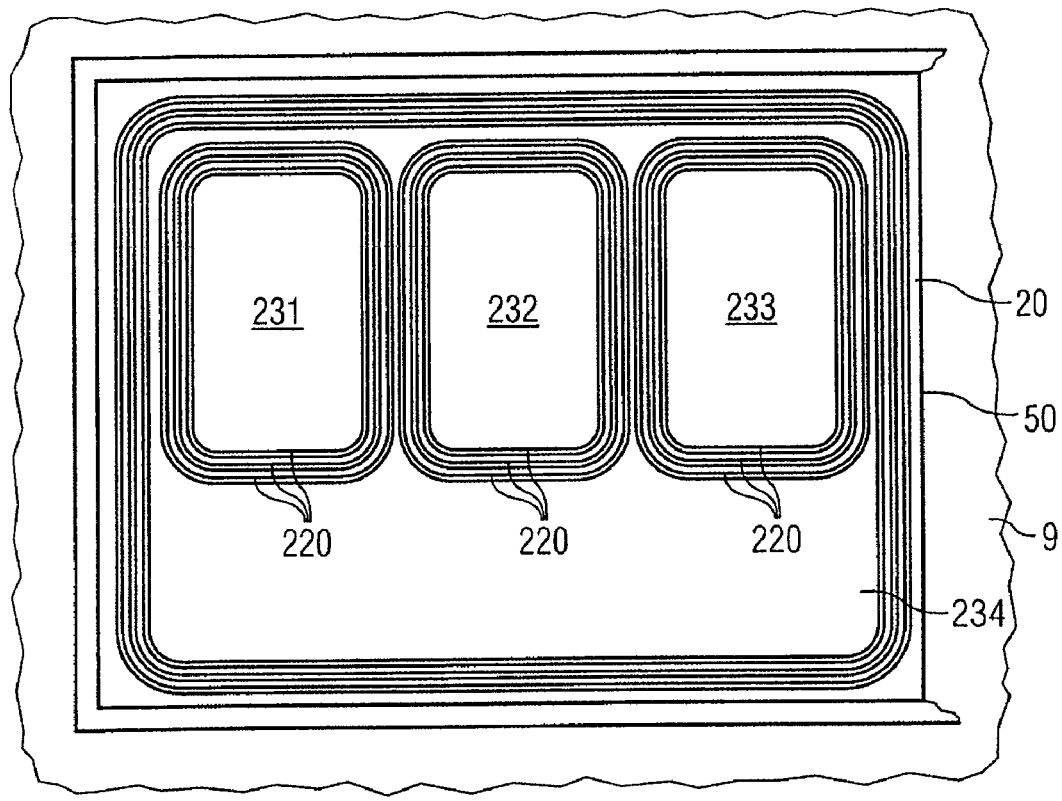
FIG. 8 shows the SOI chip according to FIG. 7 in top view.

FIG. 8 shows the basic structure of a drive circuit 20, constructed in an SOI chip, in a top view. The drive circuit 20 is arranged on a section of the patterned metallization 50 of a substrate 9 and provided for driving a three-phase full bridge having three half bridges, each of the half bridges having an upper half bridge branch and a lower half bridge branch with one power switch in each case.

The SOI chip has three sections 231, 232, 233, each of which is provided for controlling one of the power switches of the upper half bridge branches. The sections 231, 232, 233 are in each case surrounded by a number of terminal contacts 220 extending in parallel with one another.

A further section 234 of the SOI chip comprises a control circuit for all three power switches of the lower half bridge branches.

Each of the three half bridge branches has a level shifter with in each case two transistor pairs 291, 292 corresponding to the level shifter according to FIG. 7. In this arrangement, the transistor pairs (see reference symbol 291 in FIG. 7) are arranged for driving the upper half bridge branches in each case in one of the sections 231 of the SOI chip, whereas all three transistor pairs (see reference symbol 292 in FIG. 7) for driving the lower half bridge branches are located in area 234.

The total of six transistor pairs are preferably implemented in a common SOI chip and electrically insulated from one another by simple or multiple pn junctions (pn barriers) which are formed in the semiconductor body 90 and/or in the semiconductor layer 95 (see FIG. 7) between sections 231, 232, 233 and optionally 234.

In the arrangement according to FIGS. 6, 7 and 8, the potential matching for driving the upper power switches occurs by means of high-voltage level shifters 241, 242, 243 which are constructed as transistors and arranged on the SOI chip of the drive circuit.

As an alternative, it is also possible to use, instead of such high-voltage level shifters 241, 242, 243, coreless transformers (CLT) which are placed either on the chip of the drive circuit 20 or independently of the latter on the substrate. Using coreless transformers provides for DC isolation, and thus reliable insulation of the drive circuit against the power switches.

Figure 9:
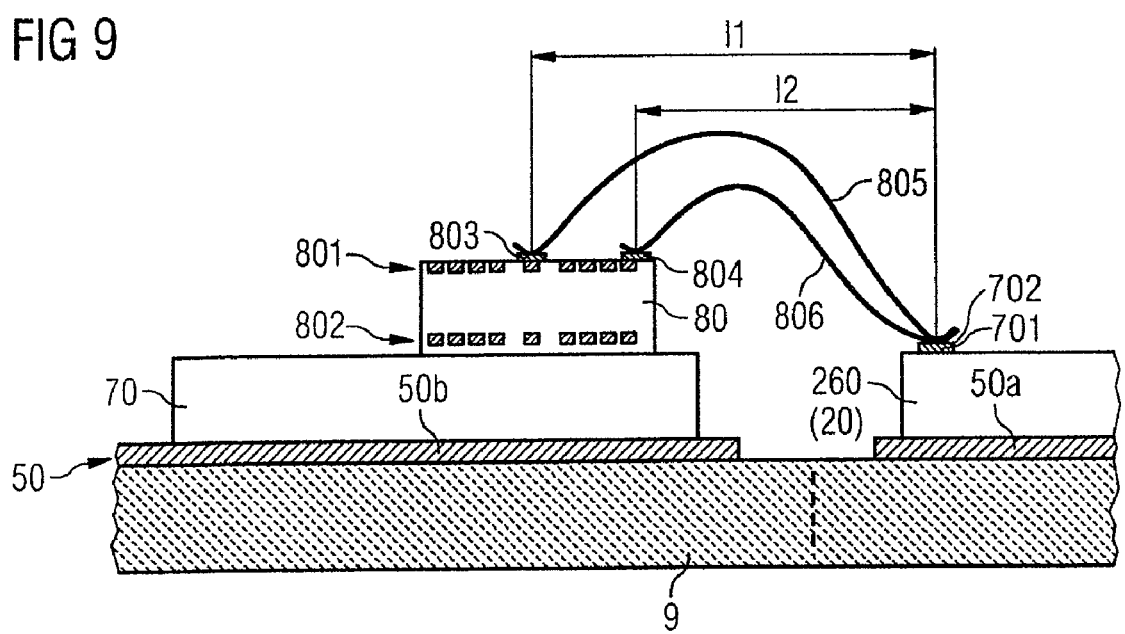
FIG. 9 shows a cross section through a circuit arrangement with a coreless transformer which is arranged on a driver chip at the secondary side, a bond being established between the coreless transformer and a driver chip on the primary side.

FIG. 9 shows a cross section through a circuit arrangement with a coreless transformer 80.

The circuit arrangement comprises a driver which is arranged in a separate driver chip 260 and which drives the power switches of the lower half bridge branches in a DC-coupled manner and the power switches of the upper half bridge branches in a DC-isolated manner by means of a coreless transformer 80.

As an alternative to a separate driver chip 260, the driver can also be integrated in the drive circuit 20 which is indicated by the reference symbol 20 placed in brackets.

The coreless transformer 80 is preferably arranged on a further driver chip 70 which is provided for driving at least one power switch of one of the upper half bridge branches. In the simplest case, the coreless transformer 80 comprises two planar spiral-shaped windings 801, 802 which are arranged in parallel with one another and opposite one another, and are insulated from one another by a dielectric.

The upper winding 801 is connected to the driver chip 260 or the drive circuit 20, respectively, and will be called primary winding 801 in the text which follows, whereas the lower winding 802 is connected to the driver chip 70 for driving the power switches. In the text which follows, the lower winding 802 is also called secondary winding 802.

Any voltage transformation resulting from the ratio of the number of turns of the primary winding 801 and the secondary winding 802 can be selectively included in the level matching.

The upper winding 801 is connected to the driver chip 260 or the drive circuit 20, respectively, preferably by means of bonding wires 805 and 806, respectively, starting from terminal pads 803 and 804, respectively, of the upper winding 801 to corresponding terminal pads 701 and 702, respectively, of the driver chip 206. The terminal pads 701, 702 are spaced apart from one another—which cannot be seen in the present view—and electrically insulated from one another.

The bond preferably extends directly from the coreless transformer 80, located on the driver chip 70, to the driver chip 260, i.e. without intermediate support point on the patterned metallization 50. The bonding wires 805, 806 extend via bonding lengths 11, 12 which are preferably selected to be smaller than or equal to 3 mm.

The driver chips 260 and 70 are arranged on sections 50a and 50b, respectively, of the patterned metallization 50. In the case in which the driver chip 70 is provided for driving a power switch of a lower half bridge branch, the section 50b of the patterned metallization 50, on which the driver chip 70 is arranged, is preferably connected to the terminal of the relevant power switch which is provided for connection to the negative supply voltage UB_ of the half bridge of this semiconductor switch.

In the other case, in which the driver chip 70 is provided for driving a power switch of an upper half bridge branch, the section 50b is preferably connected to the terminal of the relevant power switch which is provided for connection to the positive supply voltage $UB_+$ of the half bridge of this semiconductor switch.

Figure 10:
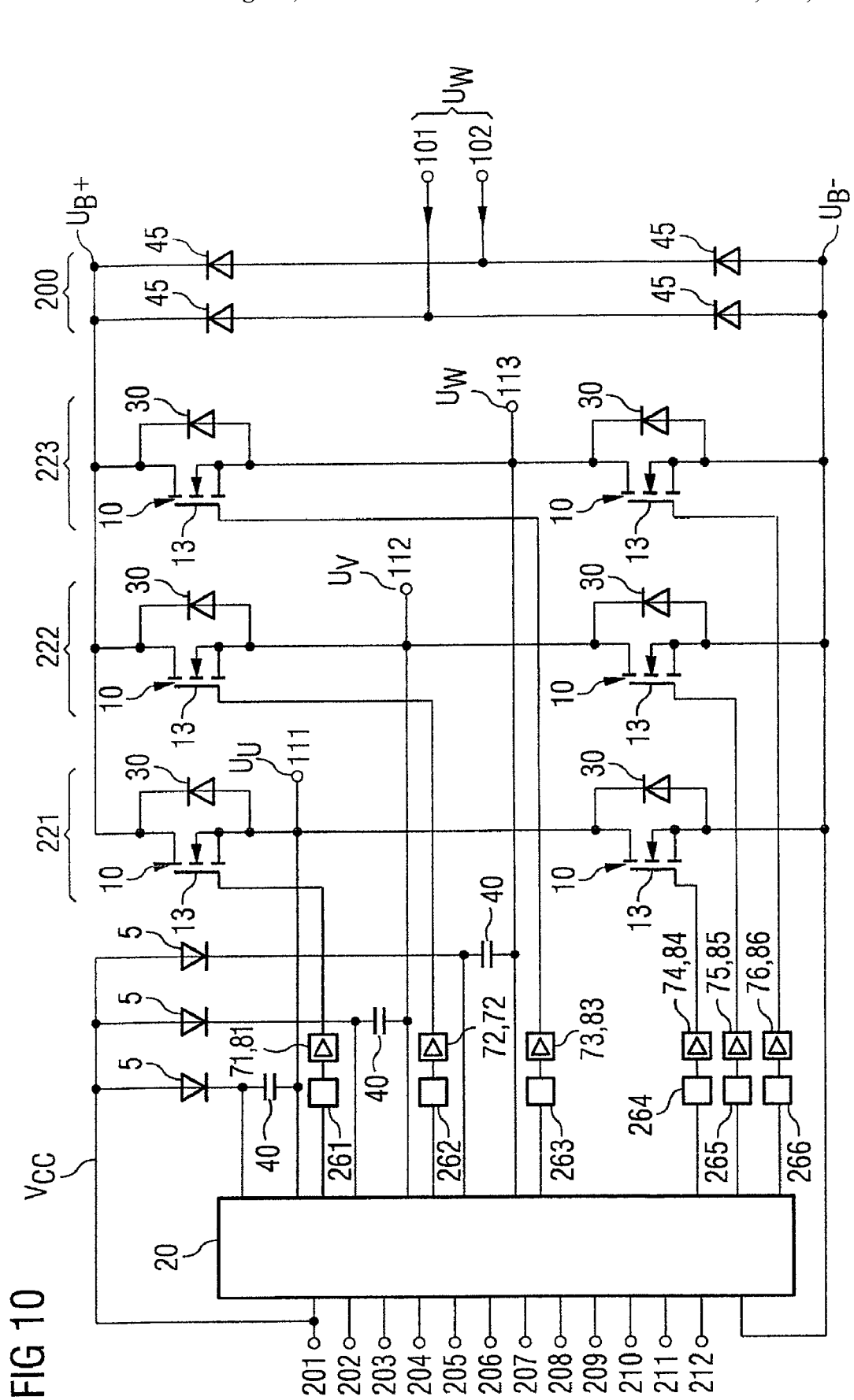
FIG. 10 shows a circuit diagram according to FIG. 4 in which, however, coreless transformers according to the coreless transformer corresponding to FIG. 9 are provided instead of transistors according to the transistor corresponding to FIG. 7 for level matching between the drive circuit and the gate terminals of the power switches.

FIG. 10 shows a circuit diagram according to FIG. 4. Differently from the circuit diagram according to FIG. 4, however, the drive circuit 20 for level matching for driving the half bridges 221, 222, 223 does not have any level shifters constructed as transistors 241 according to FIG. 7.

Instead, level matching is done by using coreless transformers 81, 82, 83, 84, 85, 86 corresponding to the coreless transformer 80 according to FIG. 9, which are preferably arranged in each case on a driver chip 71, 72, 73, 74, 75 and 76, respectively.

As an alternative, the circuits integrated in the driver chips 261, 262, 263, 264, 265 and 266, respectively, can also be jointly integrated in the drive circuit 20. Using the coreless transformers 81, 82, 83, 84, 85, 86 makes it possible to implement complete DC isolation between the drive circuit 20 and the power switches 10.

The coreless transformers 81, 82, 83, 84, 85, 86 are in each case followed by a driver stage 71, 72, 73, 74, 75, 76 which are provided for driving the power switches 10 of the half bridges 221, 222, 223.

Because of the relatively low drive voltages, the coreless transformers 84, 85, 86 and the driver stages 74, 75, 76 for driving the power switches 10 of the lower half bridge branches of the half bridges 221, 222, 223 are optional.

According to a further preferred embodiment of the invention, it is possible to integrate the drivers for driving the power switches 10 of the lower half bridge branches in one common chip instead of providing a separate chip 264, 265, 266 for each of the drivers. Three independent secondary chips 74, 75, 76 can then be connected to the common chip.

The reference potential for the drivers for driving the power switches 10 of the lower half bridge branches is preferably identical with the negative supply voltage $UB_-$ of the half bridge branches 221, 222, 223.

| List of reference designations | |
|---|---|
| 1 | Bonding wire (thick) |
| 2, 3 | Bonding wire (thin) |
| 5 | Bootstrap diode |
| 8 | Heat sink |
| 9 | Ceramic substrate |
| 10 | First semiconductor chip (controllable power semiconductor component) |
| 11 | First load terminal |
| 12 | Second load terminal |
| 13 | Gate terminal |
| 20 | Second semiconductor chip (drive electronics) |
| 21-26 | Terminals of the second semiconductor chip |
| 30 | Third semiconductor chip (freewheeling diode) |
| 31 | First load terminal |
| 32 | Second load terminal |
| 40 | Ceramic capacitor |
| 41, 42 | Ceramic capacitor terminal |
| 45 | Rectifier diode |
| 50 | Patterned metallization (upper side) |
| 50a, 50b | Section of the patterned metallization of the upper side |
| 51-59 | Section of the patterned metallization of the upper side |
| 60 | Metallization (lower side) |
| 61 | Ferrule |
| 70-73 | Driver for the upper half bridge branch |
| 74-76 | Driver for the lower half bridge branch |

-continued

| List of reference designations | |
|---|---|
| 80-86 | Coreless transformer |
| 90 | Semiconductor body |
| 93 | Edge area |
| 94 | Insulator |
| 95 | Semiconductor layer |
| 96, 97 | Shield region |
| 98 | Channel stopper |
| 99 | p-doped zone |
| 100 | n-doped zone |
| 101, 102 | Alternating-voltage input |
| 111 | Output |
| 112 | Output |
| 113 | Output |
| 201-212 | External terminals of the drive electronics |
| 220 | Terminal contacts |
| 221 | Half bridge |
| 222 | Half bridge |
| 223 | Half bridge |
| 231 | Section for driving an upper half bridge branch |
| 232 | Section for driving an upper half bridge branch |
| 233 | Section for driving an upper half bridge branch |
| 234 | Section for driving three lower half bridge branches |
| 241 | High-voltage level shifter |
| 242 | High-voltage level shifter |
| 243 | High-voltage level shifter |
| 244 | Reverse diode |
| 245 | Reverse diode |
| 246 | Reverse diode |
| 251 | Level shifter |
| 252 | Level shifter |
| 253 | Level shifter |
| 260-266 | Drive circuit |
| 501 | Layer of copper or a copper alloy |
| 502 | Nickel layer |
| 503 | Gold layer |
| 561 | Edge |
| 571 | Edge |
| 581 | Edge |
| 701, 702 | Terminal pad |
| 801 | Primary winding |
| 802 | Secondary winding |
| 803, 804 | Terminal pad |
| 805, 806 | Bonding wire |
| 812 | Secondary winding |
| 813, 814 | Terminal pad |
| 815, 816 | Bonding wire |
| 822 | Secondary winding |
| 823, 824 | Terminal pad |
| 825, 826 | Bonding wire |
| 832 | Secondary winding |
| 833, 834 | Terminal pad |
| 835, 836 | Bonding wire |
| 842 | Secondary winding |
| 843, 844 | Terminal pad |
| 845, 846 | Bonding wire |
| 852 | Secondary winding |
| 853, 854 | Terminal pad |
| 855, 856 | Bonding wire |
| 862 | Secondary winding |
| 863, 864 | Terminal pad |
| 865, 866 | Bonding wire |
| a1, a2 | Pattern spacing |
| d1-d3 | Bonding wire diameter |
| d4 | Thickness of the patterned metallization |
| l1 | Bonding length |
| l2 | Bonding length |
| r, r1-r4 | Lateral directions |
| R11-R13 | Resistance |
| R21-R23 | Resistance |
| R31-R33 | Resistance |
| Rz | Mean peak-valley depth |
| Rmax | Maximum peak-valley depth |
| $UB_+$ | Positive supply potential |
| $UB_-$ | Negative supply potential |
| UW | Alternating voltage |
| $U_U$ | Output potential |

-continued

| List of reference designations | |
|---|---|
| $U_V$ | Output potential |
| $U_W$ | Output potential |

What is claimed is:

1. A power semiconductor module comprising:
   a ceramic substrate which has on at least one side a patterned metallization with a fineness of pattern of smaller than or equal to 800 μm,
   a first semiconductor chip which comprises a power semiconductor component and which is arranged on the patterned metallization,
   a second semiconductor chip which comprises drive electronics for driving the first semiconductor chip and which is arranged on the patterned metallization, and
   at least one thin-wire bond with a bonding-wire diameter of smaller than or equal to 75 μm, which is formed between the patterned metallization and the second semiconductor chip.

2. A power semiconductor module according to claim 1, wherein at least one ceramic capacitor is arranged on the patterned metallization.

3. A power semiconductor module according to claim 1, wherein the at least one thin-wire bond has a bonding-wire diameter of smaller than or equal to 50 μm.

4. A power semiconductor module according to claim 1, wherein the patterned metallization has a nickel layer.

5. A power semiconductor module according to claim 1, wherein the patterned metallization has a gold layer.

6. A power semiconductor module according to claim 1, wherein the surface of the patterned metallization has a maximum peak-valley depth of less than or equal to 10 μm.

7. A power semiconductor module according to claim 1, wherein the surface of the patterned metallization has a mean peak-valley depth of less than or equal to 7 μm.

8. A power semiconductor module according to claim 1, wherein the first semiconductor chip has a gate terminal which is connected to an output of the second semiconductor chip via a coreless transformer.

9. A power semiconductor module according to claim 8, wherein a first driver chip is arranged between the output of the second semiconductor chip and the gate terminal.

10. A power semiconductor module according to claim 8, wherein a second driver chip is arranged between the output of the second semiconductor chip and/or an output of the first driver chip and the gate terminal.

11. A power semiconductor module according to claim 10, wherein the first semiconductor chip represents a controllable power switch of a lower branch of a half bridge and in which the second driver chip is arranged on a section of the patterned metallization which is electrically conductively connected to a load terminal, provided for connecting a negative supply voltage of the half bridge, of the first semiconductor chip.

12. A power semiconductor module according to claim 10, wherein the first semiconductor chip represents a controllable power switch of an upper branch of a half bridge and in which the second driver chip is arranged on a section of the patterned metallization which is electrically conductively connected to a load terminal, provided as load terminal of the half bridge of the first semiconductor chip.

13. A power semiconductor module according to claim 10, wherein a coreless transformer is arranged between the output of the second semiconductor chip and/or the gate terminal.

14. A power semiconductor module according to claim 12, wherein the coreless transformer is arranged on the second semiconductor chip.

15. A power semiconductor module according to claim 13, wherein a bond, the bond length of which is smaller than or equal to 3 mm, is formed between the coreless transformer and the first driver chip.

16. A power semiconductor module according to claim 15, wherein the length of all bonds formed between the coreless transformer and the first driver chip have bond lengths of smaller than or equal to 3 mm.

17. A power semiconductor module according to claim 1, comprising a third semiconductor chip which comprises a power semiconductor component and which is arranged on the patterned metallization, wherein the load current paths of the power semiconductor components of the first semiconductor chip and of the third semiconductor chip are connected in series to form a half bridge, and wherein the first semiconductor chip is allocated to the top branch of the half bridge and the third semiconductor chip is allocated to the bottom branch of the half bridge.

18. A power semiconductor module according to claim 1, wherein the second semiconductor chip is constructed as silicon on insulator chip.

19. A power semiconductor module according to claim 18, wherein the second semiconductor chip is arranged on a section of the patterned metallization, the section being spaced apart from the other sections of the patterned metallization.

20. A power semiconductor module according to claim 18, wherein the first semiconductor chip represents a controllable power switch of a lower branch of a half bridge, and in which the second semiconductor chip is arranged on a section of the patterned metallization, the section being electrically conductively connected to a load terminal, provided for connecting a negative supply voltage of the half bridge, of the first semiconductor chip.

21. A power semiconductor module according to claim 1, comprising a bootstrap diode which is arranged on the patterned metallization.

22. A power semiconductor module according to claim 1, comprising at least one bootstrap diode and/or other semiconductor chips which are arranged on the patterned metallization.

23. A method for producing a power semiconductor module as claimed in claim 1, the method comprising the step of soldering the first semiconductor chip comprising the power semiconductor component and the second semiconductor chip comprising the drive electronics to the patterned metallization in the same soldering step.

24. A power semiconductor module comprising:
   a ceramic substrate which has on at least one side a patterned metallization with a fineness of pattern of smaller than or equal to 800 μm,
   a first semiconductor chip which comprises a power semiconductor component and which is arranged on the patterned metallization,
   a second semiconductor chip which comprises drive electronics for driving the first semiconductor chip and which is arranged on the patterned metallization, and
   at least one thin-wire bond with a bonding-wire diameter of smaller than or equal to 75 μm, which is formed between the patterned metallization and the second semiconductor chip, wherein at least one ceramic capacitor is arranged on the patterned metallization, and wherein the at least one thin-wire bond has a bonding-wire diameter of smaller than or equal to 50 μm.

25. A power semiconductor module comprising:
a ceramic substrate which has on at least one side a patterned metallization with a fineness of pattern of smaller than or equal to 800 μm,
a first semiconductor chip which comprises a power semiconductor component and which is arranged on the patterned metallization,
a second semiconductor chip which comprises drive electronics for driving the first semiconductor chip and which is arranged on the patterned metallization, and
at least one thin-wire bond with a bonding-wire diameter of smaller than or equal to 75 μm, which is formed between the patterned metallization and the second semiconductor chip,
wherein the first semiconductor chip has a gate terminal which is connected to an output of the second semiconductor chip via a coreless transformer,
a first driver chip arranged between the output of the second semiconductor chip and the gate terminal, and
a second driver chip arranged between the output of the second semiconductor chip and/or an output of the first driver chip and the gate terminal.

* * * * *

UNITED STATES PATENT AND TRADEMARK OFFICE
CERTIFICATE OF CORRECTION

PATENT NO. : 7,579,682 B2  Page 1 of 1
APPLICATION NO. : 11/460867
DATED : August 25, 2009
INVENTOR(S) : Martin Hierholzer It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 510 days.

Signed and Sealed this

Fourteenth Day of September, 2010

David J. Kappos
*Director of the United States Patent and Trademark Office*